(12) United States Patent
Takamatsu et al.

(10) Patent No.: US 8,477,518 B2
(45) Date of Patent: Jul. 2, 2013

(54) DEVICE FOR DRIVING INVERTER

(75) Inventors: Naoyoshi Takamatsu, Susono (JP);
Satoshi Hirose, Miyoshi (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 333 days.

(21) Appl. No.: 12/921,956

(22) PCT Filed: Feb. 23, 2009

(86) PCT No.: PCT/JP2009/053226
§ 371 (c)(1),
(2), (4) Date: Sep. 10, 2010

(87) PCT Pub. No.: WO2009/116360
PCT Pub. Date: Sep. 24, 2009

(65) Prior Publication Data
US 2011/0007536 A1    Jan. 13, 2011

(30) Foreign Application Priority Data
Mar. 18, 2008   (JP) ................................. 2008-070056

(51) Int. Cl.
H02M 7/527 (2006.01)
(52) U.S. Cl.
USPC .......................... 363/56.05; 327/380; 327/382
(58) Field of Classification Search
USPC ............. 363/56.05, 50, 56.01, 56.02; 327/80, 327/82, 380, 382
See application file for complete search history.

(56) References Cited

U.S. PATENT DOCUMENTS

| | | | | |
|---|---|---|---|---|
| 5,926,012 A * | 7/1999 | Takizawa et al. | ............. | 323/284 |
| 5,986,484 A * | 11/1999 | Kimata | ......................... | 327/108 |
| 6,845,022 B2 * | 1/2005 | Yoshimura et al. | ............. | 363/95 |
| 2001/0002782 A1 | 6/2001 | Shimane et al. | | |
| 2004/0196678 A1 | 10/2004 | Yoshimura et al. | | |
| 2007/0115038 A1 * | 5/2007 | Higashi et al. | ................ | 327/207 |
| 2007/0221994 A1 | 9/2007 | Ishikawa et al. | | |

FOREIGN PATENT DOCUMENTS

| | | |
|---|---|---|
| JP | A-2001-169407 | 6/2001 |
| JP | A-2004-096830 | 3/2004 |
| JP | A-2004-312817 | 11/2004 |
| JP | A-2007-089325 | 4/2007 |
| JP | A-2007-259576 | 10/2007 |
| JP | A-2009-027881 | 2/2009 |

OTHER PUBLICATIONS

International Search Report in International Application No. PCT/JP2009/053226, dated Mar. 24, 2009 (with English translation).

* cited by examiner

*Primary Examiner* — Harry Behm
(74) *Attorney, Agent, or Firm* — Oliff & Berridge, PLC

(57) ABSTRACT

Disclosed is a device for driving an inverter having a semiconductor switching element. A gate voltage calculating unit (20) calculates a surge voltage from the temperature, current, and DC-side voltage of each of IGBTs of the inverter and compares the surge voltage with the breakdown voltage of the element. The gate voltage calculating unit (20) commands a gate voltage control unit (22) to set a gate voltage higher than the normal value (reference value) in the case of judging that the difference between the element breakdown voltage and the surge voltage exceeds a predetermined threshold voltage and that a margin exists in the surge voltage. The voltage control unit (22) performs switching control of gates of the IGBTs according to the gate voltage command higher than the reference voltage to thereby reduce stationary losses of the IGBTs.

4 Claims, 11 Drawing Sheets

DEVICE FOR DRIVING INVERTER

TECHNICAL FIELD

The present invention relates to a device for driving an inverter, and more particularly to suppression of surge voltage and reduction in stationary loss (on-state power loss).

BACKGROUND ART

Motors for motor-driven vehicles such as hybrid vehicles and electronic vehicles are driven by alternating current power generated by an inverter. An inverter generally includes power transistors such as IGBTs (Insulated Gate Bipolar Transistors) configured in three-arm bridge connection, and these power transistors are gate-controlled to perform switching, thereby converting direct current power to alternating current power.

Patent Document 1 discloses a structure in which the temperature of an IGBT is detected and, using the output command current, the battery voltage, and the IGBT temperature as parameters, a resistance value of the gate resistor is controlled such that a voltage including a surge voltage to be applied to the IGBT attains a predetermined value which is below an allowable breakdown voltage.

Further, Patent Document 2 discloses adjusting the gate voltage in accordance with the IGBT temperature and the direct current side voltage information, and more specifically discloses that the gate voltage is set low in order to reduce noise when the temperature of coolant of an element is low and a thermal margin exists and that the gate voltage is set high in order to reduce the switching loss when the direct current side voltage of the inverter is high.

FIG. 14 illustrates a structure of conventional technology. FIG. 14 is a view illustrating a structure of an inverter device for driving a motor. A direct current voltage of a battery 1 is converted by an inverter device 2 into a three-phase alternating current voltage having variable voltages and variable frequencies, which is then supplied to an AC motor 3. The inverter device 2 includes an inverter main circuit 21, a voltage smoothing capacitor 22, and an inverter controller 23. The inverter main circuit 21 is formed of IGBTs 211 in a three-phase bridge connection configuration, and each IGBT includes an anti-parallel diode 212. The inverter controller 23 includes a gate-driving circuit 231 which applies a gate voltage to the IGBTs 211 to drive the IGBTs 211 ON and OFF. Further, a voltage-adjustable gate power source circuit 232 is provided for adjusting the output voltage of the gate-driving circuit 231, and the output voltage thereof is controlled by a gate power source voltage control circuit 233. A voltage command is applied to the gate power source voltage control circuit 233 from a voltage command device 234. The voltage command device 234 acquires an output of a voltage detector 235 which detects a direct current voltage of the inverter main circuit 21 and an output of a temperature detector 238 which detects a temperature of a coolant which cools the IGBT 211 or those IGBTs, and determines the voltage command. The voltage detector 235 detects the voltage between direct current side terminals P and N of the inverter main circuit 21; i.e., the voltage of the voltage smoothing capacitor 22. When the direct current voltage is high, which means that the switching loss is also great, the gate voltage is increased to reduce the loss. Further, when the output of the temperature detector 238 which detects the temperature of the IGBT 211 and the coolant is low and a margin exists in the thermal loss of the IGBT 211, the gate voltage is increased to reduce the switching noise of the element.

Further, Patent Document 3 discloses detecting the temperature of a power semiconductor switching element and varying the gate voltage or the gate resistance based on the detected value, to thereby reduce the temperature dependency of the element loss. Specifically, Patent Document 3 discloses increasing the gate voltage or reducing the gate resistance when the element temperature is high.

Patent Literature 1: JP 2001-169407 A

Patent Literature 2: JP 2007-89325 A

Patent Literature 3: JP 2007-259576 A

DISCLOSURE OF THE INVENTION

Technical Problems

However, all of the conventional technologies described above merely reduce either the surge voltage or the stationary loss (on-state power loss) of IGBT, and do not reduce both the surge voltage and the stationary loss (on-state power loss). In particular, for inverters installed in vehicles, as the efficiency of the inverter is directly related to fuel efficiency, it is very significant to reduce the loss not only at the time of switching but also in the stationary state.

The object of the present invention is to provide a device for driving an inverter, which is capable of achieving both suppression of the surge voltage and reduction in the stationary loss.

Solutions to the Problems

In accordance with one aspect of the present invention, there is provided a device for driving an inverter having a semiconductor switching element, the device including an operation unit which calculates a surge voltage based on at least a temperature, an electric current, and a direct current side voltage of the semiconductor switching element, and a gate voltage application unit which applies a gate voltage to a gate of the semiconductor switching element, the gate voltage application unit controlling increase and decrease of the gate voltage based on a comparison result between the surge voltage which is calculated and an element breakdown voltage of the semiconductor switching element.

In the present invention, the gate voltage application unit may control the gate voltage to a value which is higher than a predetermined reference value when the surge voltage is less than the element breakdown voltage and also when a difference between the surge voltage and the element breakdown voltage exceeds a predetermined threshold voltage, and may set the gate voltage to the reference value when the surge voltage is less than the element breakdown voltage and a difference between the surge voltage and the element breakdown voltage is equal to or less than the predetermined threshold value.

Further, in the present invention, the gate voltage application unit may set the gate voltage to a value which is lower than the reference value when an electric current flowing in the switching element is equal to or less than a predetermined threshold current.

Also, in the present invention, the gate voltage application unit may set the gate voltage to a value which is lower than the reference value or a value which is still lower than the gate voltage which has been increased or decreased, when a temperature of the switching element is equal to or less than a predetermined threshold temperature.

Advantageous Effects of the Invention

According to the present invention, both suppression of surge voltage and reduction in stationary loss can be achieved.

BRIEF DESCRIPTION OF THE DRAWINGS

These and other objects of the invention will be explained in the description below, in connection with the accompanying drawings, in which:

FIG. 4 is a graph chart illustrating the relationship between the gate voltage and the surge voltage at the time of turn-on;

REFERENCE SIGNS LIST

10 accelerator opening degree detection unit, 12 direct current voltage detection unit, 14 IGBT temperature detection unit, 16 command electric current value output unit, 18 IGBT gate switching unit, 20 gate voltage calculating unit, 22 gate voltage control unit, 24 rotational position sensor.

BEST MODE FOR CARRYING OUT THE INVENTION

Preferred embodiments of the present invention will be described with reference to the drawings.

First Embodiment

Figure 1:
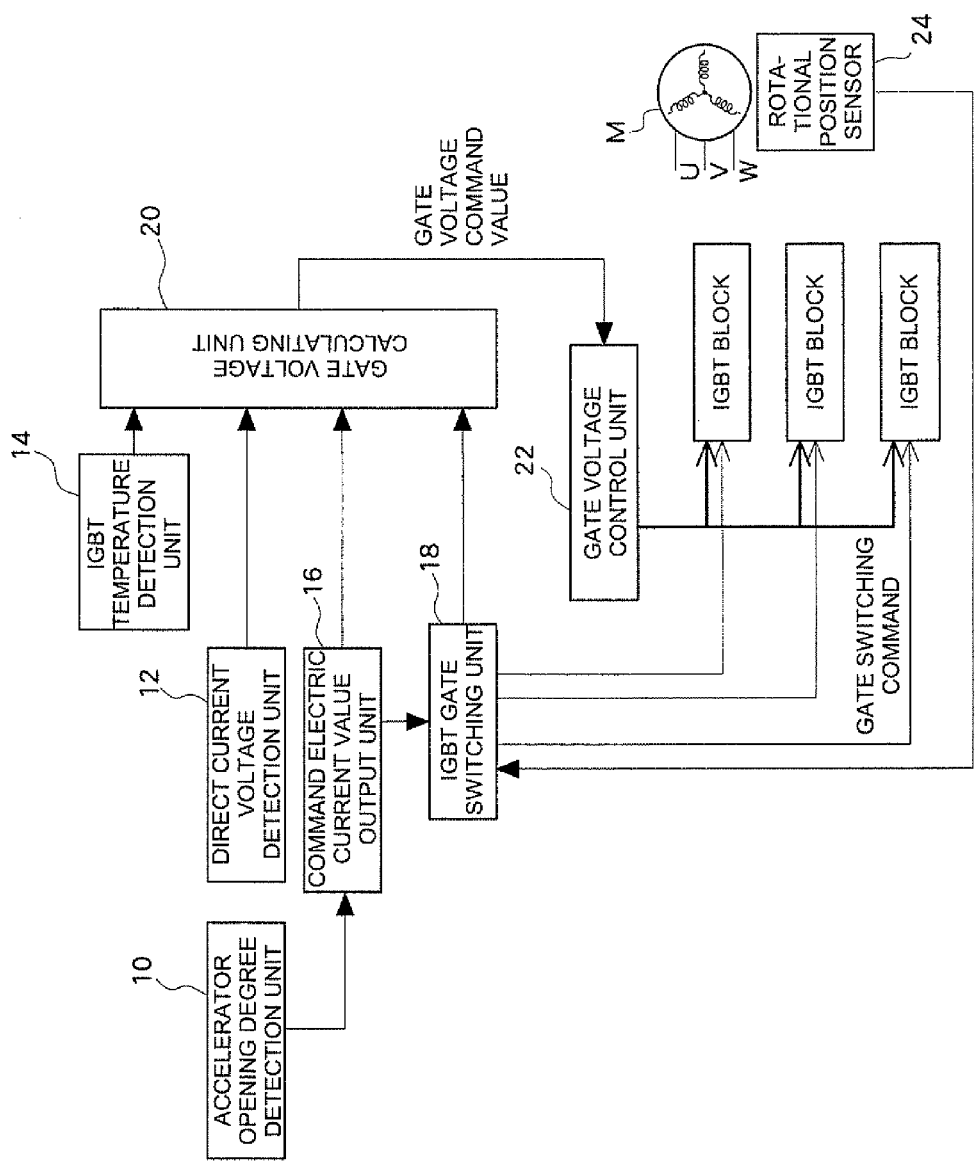
FIG. 1 is a view illustrating an embodiment of an inverter control circuit of the present invention.

FIG. 1 illustrates a structure of an inverter control circuit according to the present embodiment. The inverter control circuit includes various sensors, a gate voltage calculating unit 20 which calculates the gate voltage based on data from the various sensors, and a gate voltage control unit 22 which controls the gate voltage of an IGBT of the inverter based on a command from the gate voltage calculating unit 20.

An accelerator opening degree detection unit 10 detects the opening degree of an accelerator caused by an operation performed by the driver, and supplies the data on opening degree to a command electric current value output unit 16.

A direct current voltage detection unit 12 detects a direct current voltage of the inverter and supplies the detected direct current voltage to the gate voltage calculating unit 20.

An IGBT temperature detection unit 14 detects the temperature of the IGBT or the temperature of a coolant of the IGBT and supplies the detected temperature to the gate voltage calculating unit 20.

The command electric current value output unit 16 sets a command electric current value based on the data on the accelerator opening degree detected by the accelerator opening degree detection unit 10, and supplies the value to the gate voltage calculating unit 20 and an IGBT gate switching unit 18.

Figure 14:
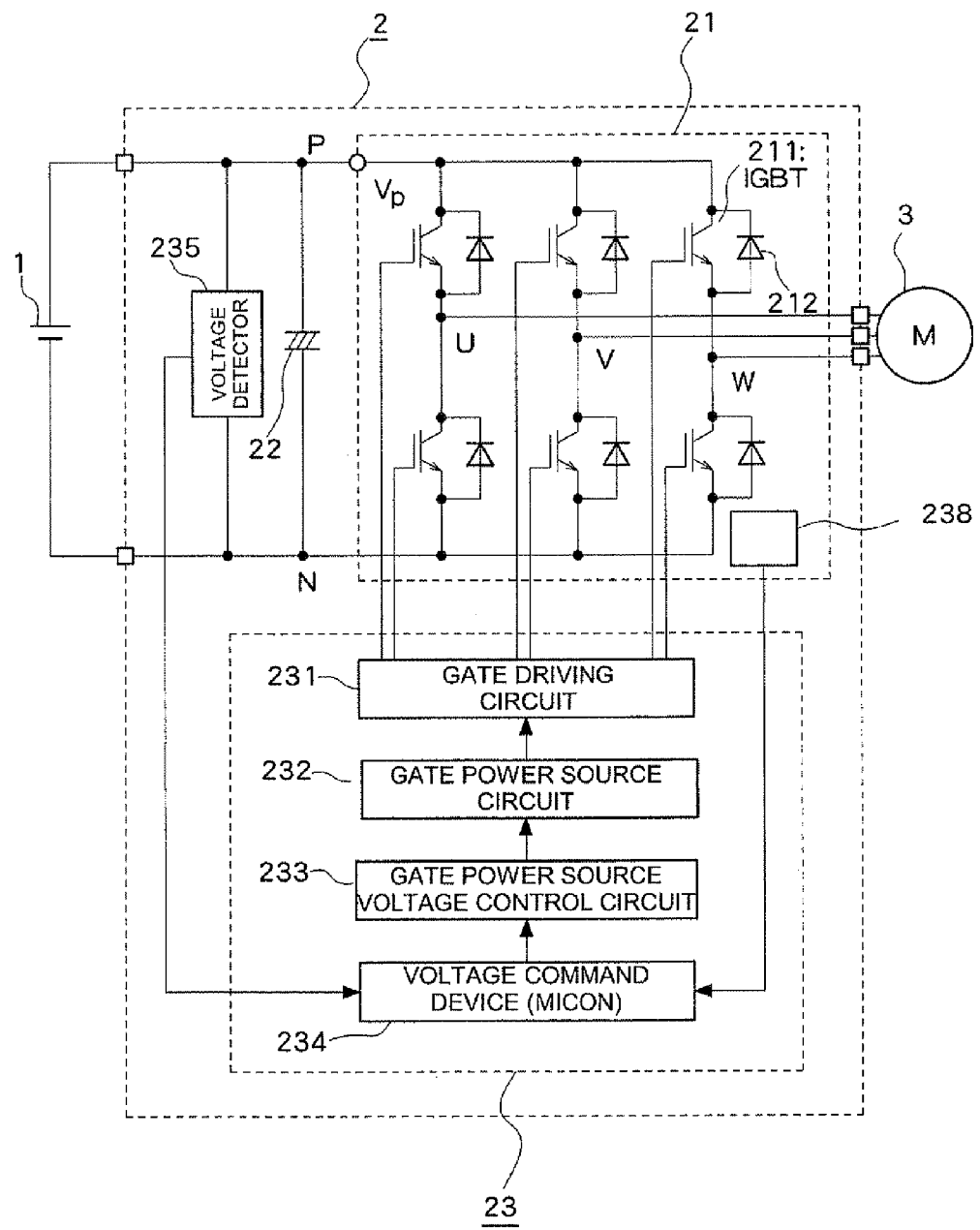
FIG. 14 is a view illustrating the structure of a conventional device.

The IGBT gate switching unit 18 outputs a gate switching command to each of IGBT blocks forming the inverter to thereby control ON and OFF of IGBTs within each IGBT block. The IGBT block includes IGBTs having a three-phase bridge connection structure similar to that of the conventional inverter main circuit 21 illustrated in FIG. 14, and each IGBT 211 includes the anti-parallel diode 212.

Each IGBT block supplies driving current of U phase, V phase, and W phase to a motor M. Here, although the motor M is a so-called motor generator which also serves as a generator, in the present embodiment this motor is simply referred to as the motor M. A rotational position sensor 24 which detects a rotational position is provided to the motor M to supply a position detection signal to the IGBT gate switching unit 18. The IGBT gate switching unit 18 controls ON and OFF of each IGBT based on the command current value and the rotational position.

The gate voltage calculating section 20, based on the direct current voltage data from the direct current voltage detection unit 12, the temperature data from the IGBT temperature detection unit 14, the command current value from the command current value output unit 16, and the gate switching command from the IGBT gate switching unit 18, calculates the gate voltage and supplies a gate voltage command value to the gate voltage control unit 22. Specifically, the gate voltage calculating unit 20 calculates the surge voltage of the IGBT based on the direct current voltage data, the temperature data, and the command current value; compares the surge voltage and the element breakdown voltage; and calculates the gate voltage in accordance with the comparison result. Here, voltages of three stages, including a normal voltage, a voltage higher than the normal voltage, and a voltage lower than the normal voltage, are prepared as the gate voltage, and one of these voltages is selected to obtain the gate voltage. The normal voltage can also be referred to as a reference voltage. The normal voltage serving as a reference voltage is set to 15V, for example.

The gate voltage control unit 22 adjusts the gate voltage to one of the three stages in accordance with the gate voltage command value supplied from the gate voltage calculation unit 20 and supplies the adjusted gate voltage to the gate of each of IGBTs within the IGBT block.

Figure 2:
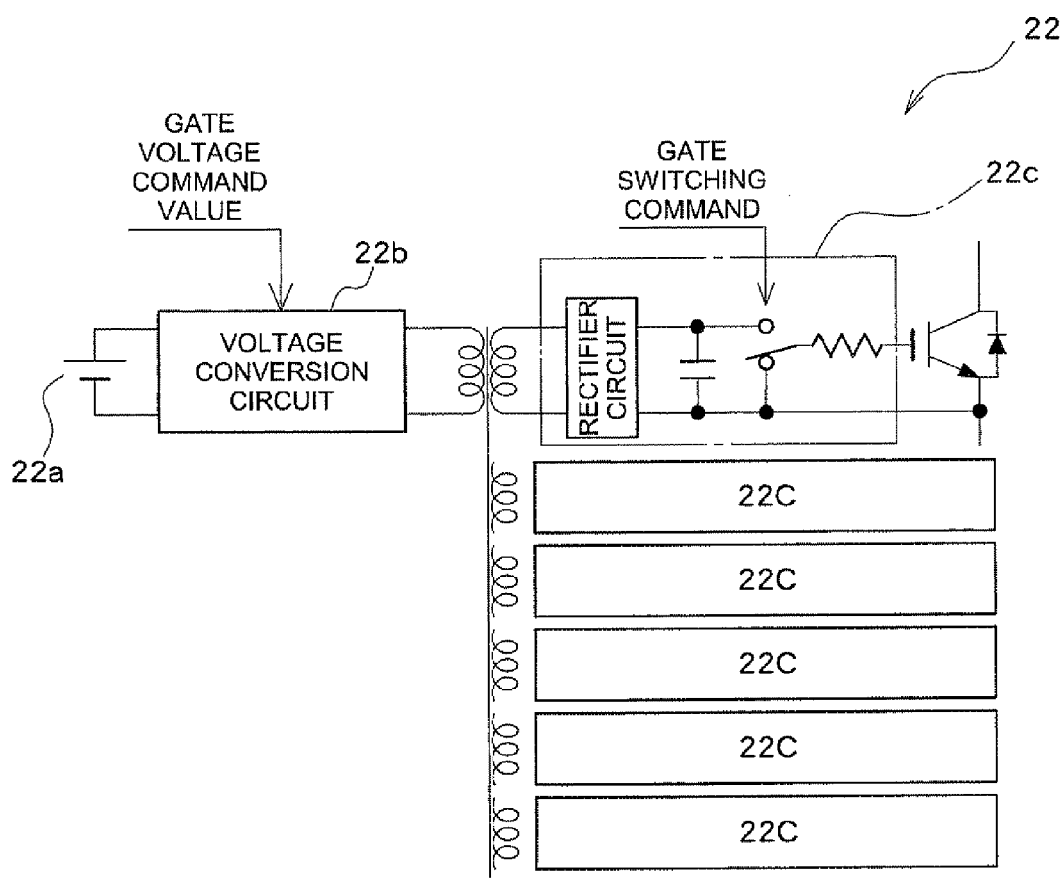
FIG. 2 is a view illustrating a structure of a gate voltage control unit of FIG. 1.

FIG. 2 illustrates a circuit structure of the gate voltage control unit 22 of FIG. 1. The gate voltage control unit 22 uses, as a power source voltage, an insulating power source provided for upper and lower arms of each of U, V, and W phases.

A voltage conversion circuit 22b converts voltage from an insulating power source 22a provided for the upper and lower arms of each phase based on the gate voltage command value supplied from the gate voltage calculating unit 20, and supplies the converted voltage to an IGBT drive circuit 22c.

The IGBT drive circuit 22c includes a rectifier circuit, a capacitor, and a switching element, and is connected to a gate of each IGBT. The rectifier circuit supplies voltage-converted gate voltage to the switching element, which switches ON and OFF in accordance with the gate switching command from the IGBT gate switching unit 18 in order to apply the gate voltage to the gate of the IGBT.

Figure 3:
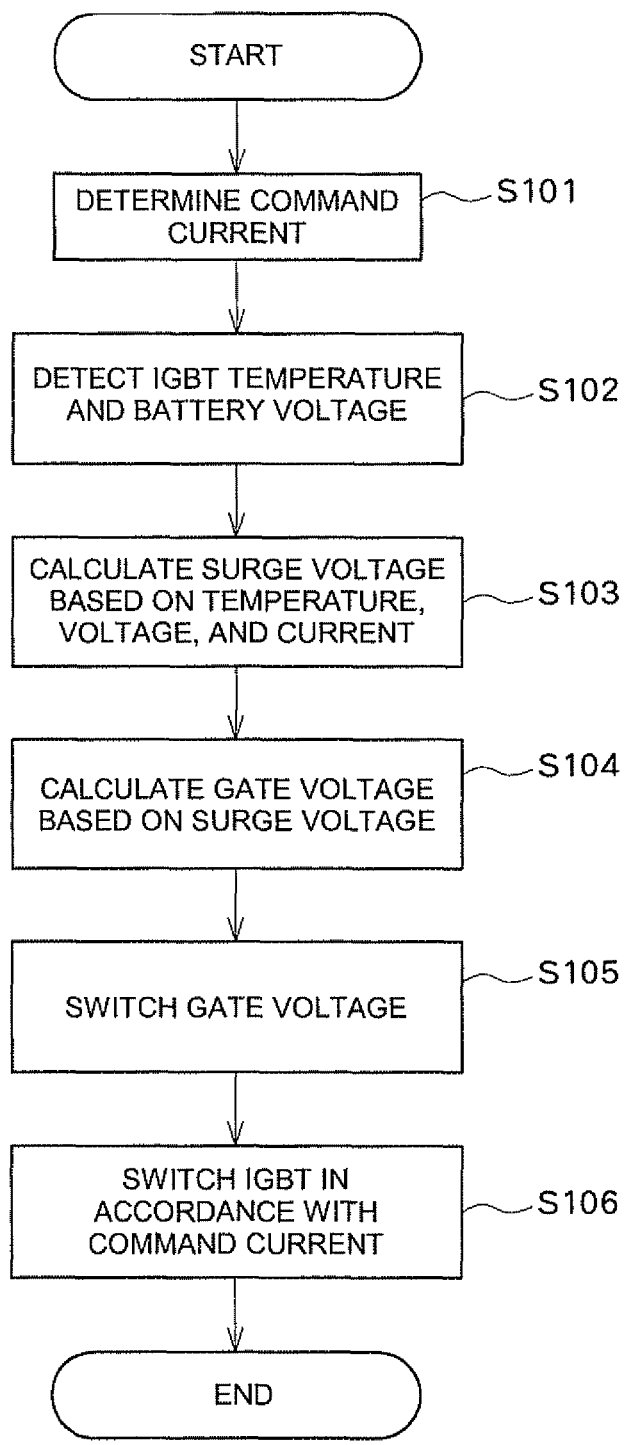
FIG. 3 is a flowchart of processing according to the embodiment.

FIG. 3 illustrates a processing flowchart according to the present embodiment. First, the command current value output unit 16 determines a command current value in accordance with the opening degree of an accelerator (S101). Further, the detection units 12 and 14 detect the inverter direct current voltage; i.e., the battery voltage and the IGBT temperature, respectively (S102). Then, based on the IGBT temperature, the battery voltage, and the command current value, the surge voltage of the IGBT is calculated (S103). Specifically, a relationship between the IGBT temperature, the battery voltage, and the command current value, and the surge voltage is previously measured at a plurality of measuring points to create a map, which is then stored in a memory. Then, by reference to this map, the surge voltage corresponding to the current IGBT temperature, battery voltage, and command current value is read and calculated. When the corresponding surge voltage does not exist in the map, the surge voltage is calculated by interpolation processing using points near the target points.

After calculation (estimation) of the surge voltage, the gate voltage is calculated based on this surge voltage (S104). Specifically, the magnitudes of the element breakdown voltage and the surge voltage of the IGBT are compared with each other, and the gate voltage is calculated in accordance with whether or not a margin exists in the surge voltage. Generally, the surge voltage of an inverter increases as the gate voltage becomes higher. As an inverter will be broken when the surge voltage exceeds the element breakdown voltage of the IGBT, the gate resistance and the gate voltage are set such that the surge voltage is equal to or less than the element breakdown voltage. Thus, the gate voltage which is set to be equal to or less than the element breakdown voltage is a normal value (a reference value).

However, there is a problem that, while the surge voltage can be suppressed by increasing the gate resistance or lowering the gate voltage, the stationary loss is increased simultaneously. In order to deal with this problem, according to the present embodiment, a condition in which the surge voltage is lower than the element breakdown voltage is determined, and the gate voltage is increased when it is determined that a sufficient margin exists in the surge voltage, thereby suppressing the stationary loss. It is obvious that the gate voltage is increased within a range in which the gate voltage is equal to or less that the element breakdown voltage. Assuming that the element breakdown voltage is Vth and the normal value (reference value) which is set to be equal to or less than the element breakdown voltage is Vg0, Vg0 is increased to Vg1 (Vg0<Vg1≦Vth) when a sufficient margin exists in the surge voltage. By increasing the gate voltage, both the reduction in the switching loss and the reduction in the stationary loss of the inverter can be achieved, and particularly, there can be achieved an advantage of the reduction in the stationary loss which cannot be obtained in a structure in which the resistance is simply changed.

Figure 4:
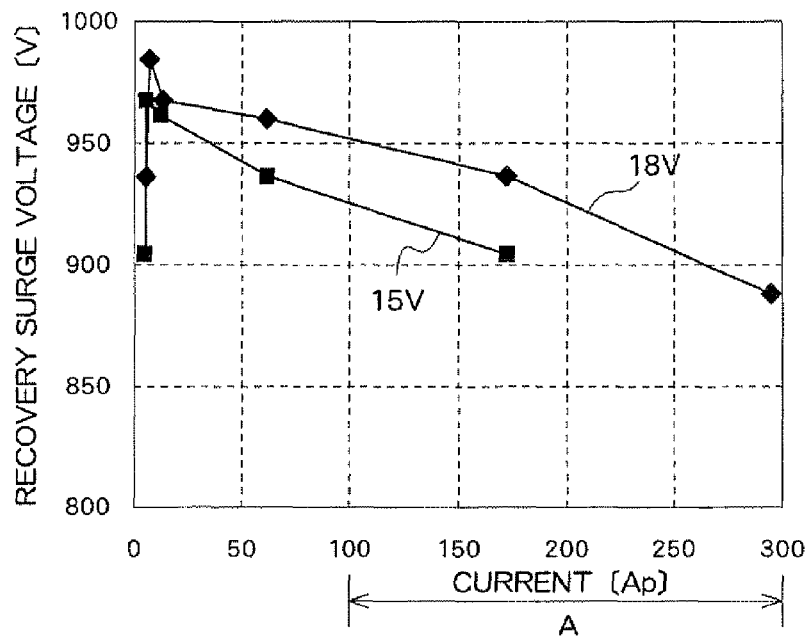
Figure 5:
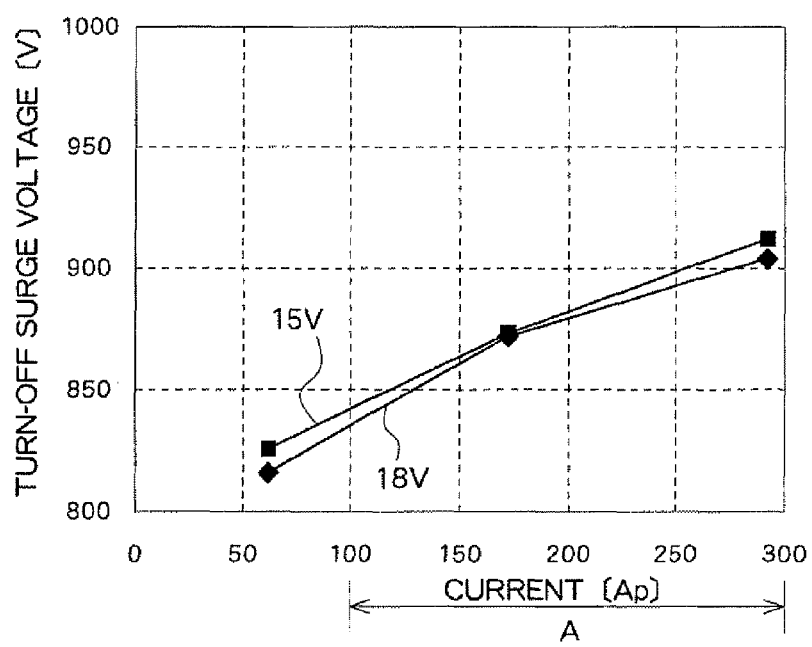
FIG. 5 is a graph chart illustrating the relationship between the gate voltage and the surge voltage at the time of turn-off.

FIGS. 4 and 5 illustrate the current dependency of the surge voltage at the time of turn-on (FIG. 4) and at the time of turn-off (FIG. 5), respectively. In both figures, the current dependency when the gate voltage is 15V and the current dependency when the gate voltage is 18V are compared.

At the time of turn-on, the greater the current, the lower the surge voltage; and the higher the gate voltage, the greater the surge voltage. When the element breakdown voltage is 950V, the range A satisfies the condition that the surge voltage≦element breakdown voltage. In this range, because a margin exists in the surge voltage, no problems arise even if the gate voltage is increased from 15V to 18V. Similar conditions can be applied to the case of FIG. 5. Whether or not a margin exists in the surge voltage can be determined by, for example, calculating a difference between the element breakdown voltage and the surge voltage and determining whether or not the difference value is equal to or greater than a predetermined threshold value. If the relationship of (element breakdown value−surge voltage)>threshold value is satisfied, it is determined that a margin exists in the surge voltage, and the gate voltage is increased. If the relationship of (element breakdown value−surge voltage)≦threshold value is satisfied, it is determined that no margin exists in the surge voltage, and the normal gate voltage (reference value) is maintained.

Referring back to FIG. 3, after calculating the gate voltage as described above, the gate voltage is switched (S105), and switching of the IGBT is controlled in accordance with the command current value (S106).

As described above, according to the present embodiment, the surge voltage is calculated and the magnitude of the surge voltage is compared with the element breakdown voltage in order to determine whether or not a margin exists in the surge voltage. If the surge voltage has a margin, the gate voltage is increased to a value which is higher than the normal value (reference value), to thereby reduce the stationary loss. Although in the present embodiment the gate voltage is switched to a value which is higher than the normal value when a margin exists in the surge voltage, the voltage value which is higher than the normal value (reference value) is not limited to a fixed value, and may be a variable value which gradually varies in accordance with a difference value between the element breakdown voltage and the surge voltage. Specifically, the greater a margin in the surge voltage, the higher the set gate voltage.

Second Embodiment

Figure 6:
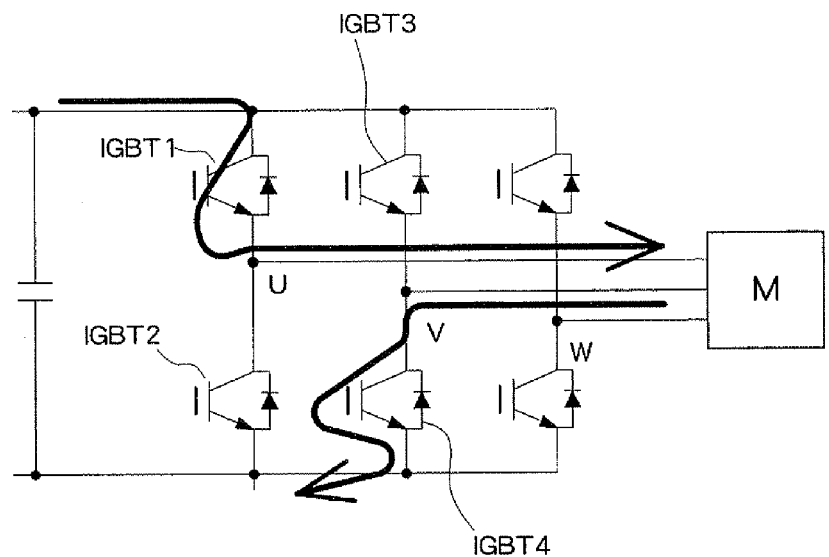
FIG. 6 is an explanatory view illustrating flow of the electric current of an inverter.

Normally, the current flows in an IGBT only on one side of the upper and lower arms of each phase forming an inverter. FIG. 6 illustrates an example of the upper and lower arms of each phase forming an inverter and the current flow. In the figure, while the current flows in the upper arm IGBT1, no current flows in the lower arm IGBT2. Accordingly, the drive circuit 22c of the IGBT2 in which no current flows operates uselessly. This also applies to the drive circuit 22c for the IGBT3.

Accordingly, in the present embodiment, the gate voltage of the IGBT drive circuit 22c which drives an IGBT element in which no current flows is set to a low voltage, to thereby reduce loss in the IGBT drive circuit 22c.

Figure 7:
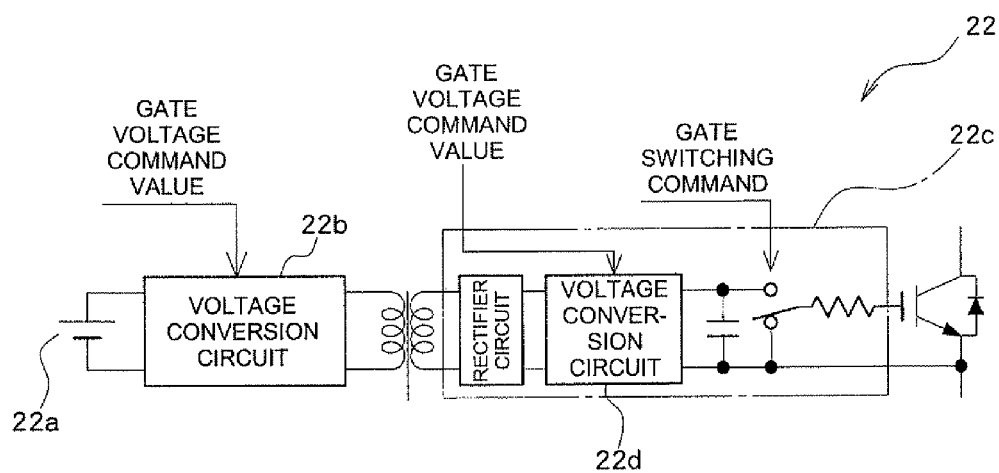
FIG. 7 is a view illustrating another structure of the gate voltage control unit.

FIG. 7 illustrates a structure of an IGBT drive circuit 22c according to the present embodiment. The IGBT drive circuit 22c illustrated in FIG. 7 differs from the IGBT drive circuit 22c illustrated in FIG. 2 in that the IGBT drive circuit 22c in FIG. 7 further includes a voltage conversion circuit 22d in addition to the voltage conversion circuit 22b. The voltage conversion circuit 22d controls the gate voltage in accordance with a gate voltage command value supplied from the gate voltage calculating unit 20. More specifically, the voltage conversion circuit 22d switches the gate voltage between two stages of voltages; i.e., the normal voltage and the voltage which is lower than the normal voltage. Here, although the voltage conversion circuits 22b and 22d are provided in FIG.

7, the voltage conversion circuit 22*b* is not necessary if only the loss in the IGBT drive circuit 22*c* is reduced.

Figure 8:
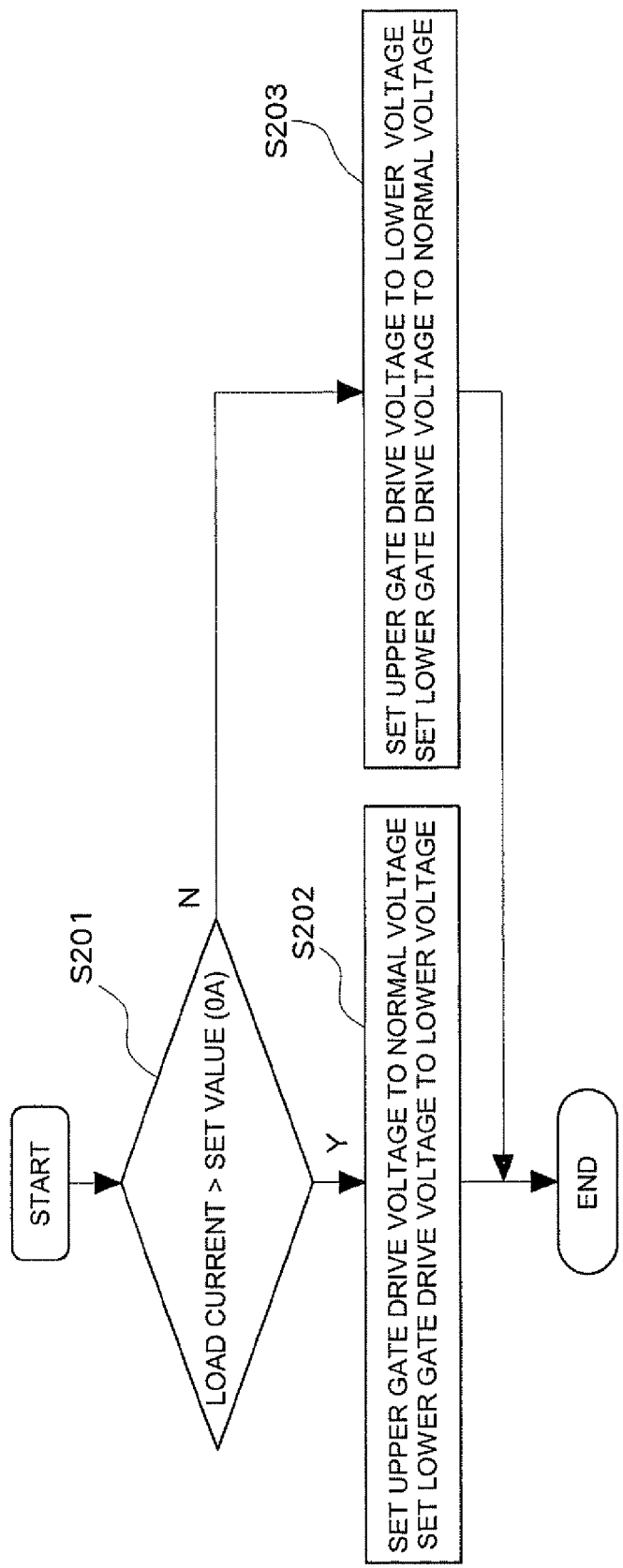
FIG. 8 is a flowchart of processing according to another embodiment.

FIG. 8 illustrates a processing flowchart according to the present embodiment. The gate voltage calculating unit 20 compares a load current (which refers to an electric current to be supplied to the motor M, with the direction of the current flowing into the motor M being a positive direction) with a set value (e.g., 0 A) (S201). When the load current exceeds the set value, the gate drive voltage of the upper arm IGBT is set to a normal value and the gate drive voltage of the lower arm IGBT is set to a voltage which is lower than the normal value (S202). Accordingly, in the example of FIG. 6, the gate voltage of the IGBT1 in which current flows is set to a normal value, and the gate voltage of the IGBT2 in which no current flows is set to a value which is lower than the normal value. On the other hand, when the load current does not exceed the set value, the gate drive voltage of the upper arm IGBT is set to a voltage which is lower than the normal voltage and the gate drive voltage of the lower arm IGBT is set to the normal value (S203). Accordingly, in the example of FIG. 6, the gate voltage of the IGBT3 in which no current flows is set to a value which is lower than the normal value, and the gate voltage of the IGBT4 in which current flows is set to the normal value.

Figure 9:
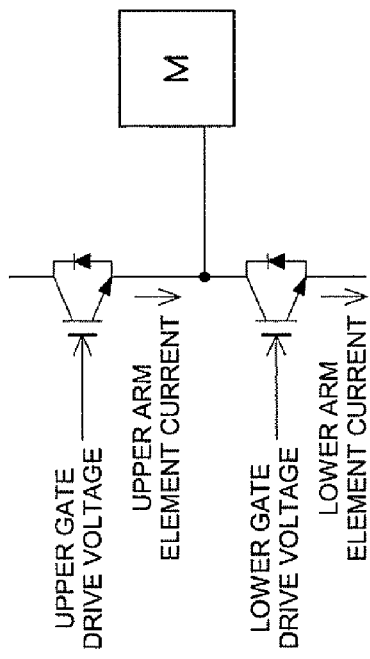
FIG. 9 is an explanatory view illustrating the definition of element current.

Although in the above example the gate voltage is controlled by using a load current to be supplied to the motor M, the gate voltage can also be controlled by using an upper arm element current or a lower arm element current, as illustrated in FIG. 9. In FIG. 9, the current flowing in the upper arm IGBT is defined as the upper arm element current, the current flowing in the lower arm IGBT is defined as the lower arm element current, and the direction of the arrow in the figure is defined as a positive direction.

Figure 10:
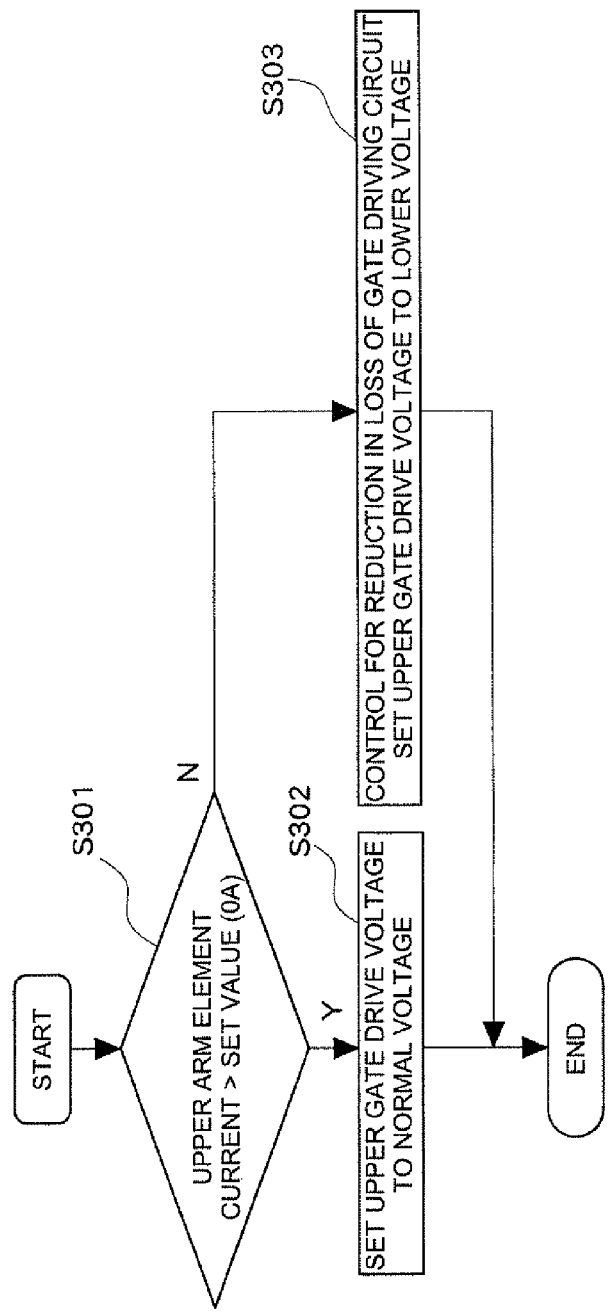
FIG. 10 is a flowchart of processing according to still another embodiment.

FIG. 10 illustrates a processing flowchart in the case of control by using the upper arm element current. The upper arm element current is compared with a set value (e.g., 0 A) (301). If the upper arm element current exceeds the set value, the gate voltage of the upper arm IGBT is set to a normal value (S302), and if the upper arm element current does not exceed the set value, the gate voltage of the lower arm IGBT is set to a value lower than the normal value (S303). Accordingly, in the example of FIG. 6, the gate voltage of the IGBT1 in which current flows is set to a normal value, and the gate voltage of the IGBT2 in which no current flows is set to a value which is lower than the normal value.

Figure 11:
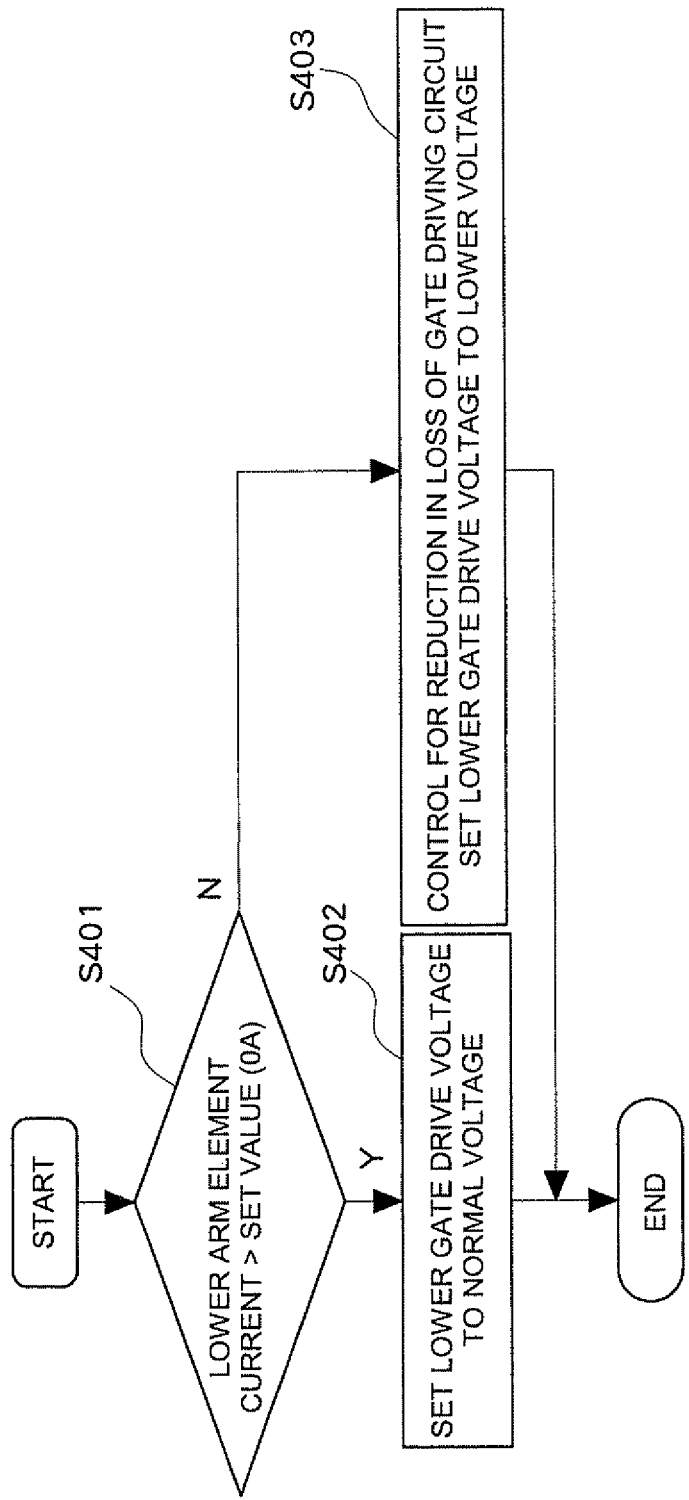
FIG. 11 is a flowchart of processing according to a further embodiment.

FIG. 11 illustrates a processing flowchart in the case of control by using the lower arm element current. The lower arm element current is compared with a set value (e.g., 0 A) (401). If the lower arm element current exceeds the set value, the gate voltage of the lower arm IGBT is set to a normal value (S402), and if the lower arm element current does not exceed the set value, the gate voltage of the upper arm IGBT is set to a value lower than the normal value (S403). Accordingly, in the example of FIG. 6, the gate voltage of the IGBT3 in which no current flows is set to a value which is lower than the normal value, and the gate voltage of the IGBT4 in which current flows is set to the normal value.

As described above, by setting the gate voltage of the IGBT in which no current flows to a low voltage, the loss of the drive circuit 22*c* can be reduced.

Third Embodiment

In the first embodiment, when a margin exists in the surge voltage, the gate voltage is set to a voltage which is higher than the normal voltage, to thereby reduce the stationary loss, and when the IGBT temperature or the temperature of a coolant is low, the element breakdown voltage is lowered and the gate voltage is set to a low value accordingly. In this case, however, a state in which the gate voltage is relatively high is maintained for the purpose of reduction in the stationary loss, which results in a state of low element breakdown voltage being maintained for a long time.

In order to deal with this disadvantage, according to the present embodiment, when the IGBT temperature or the coolant temperature is low, the gate voltage is set to a further lower value to systematically increase the stationary loss, thereby achieving rise in the temperature of the IGBT within a short period.

Figure 12:
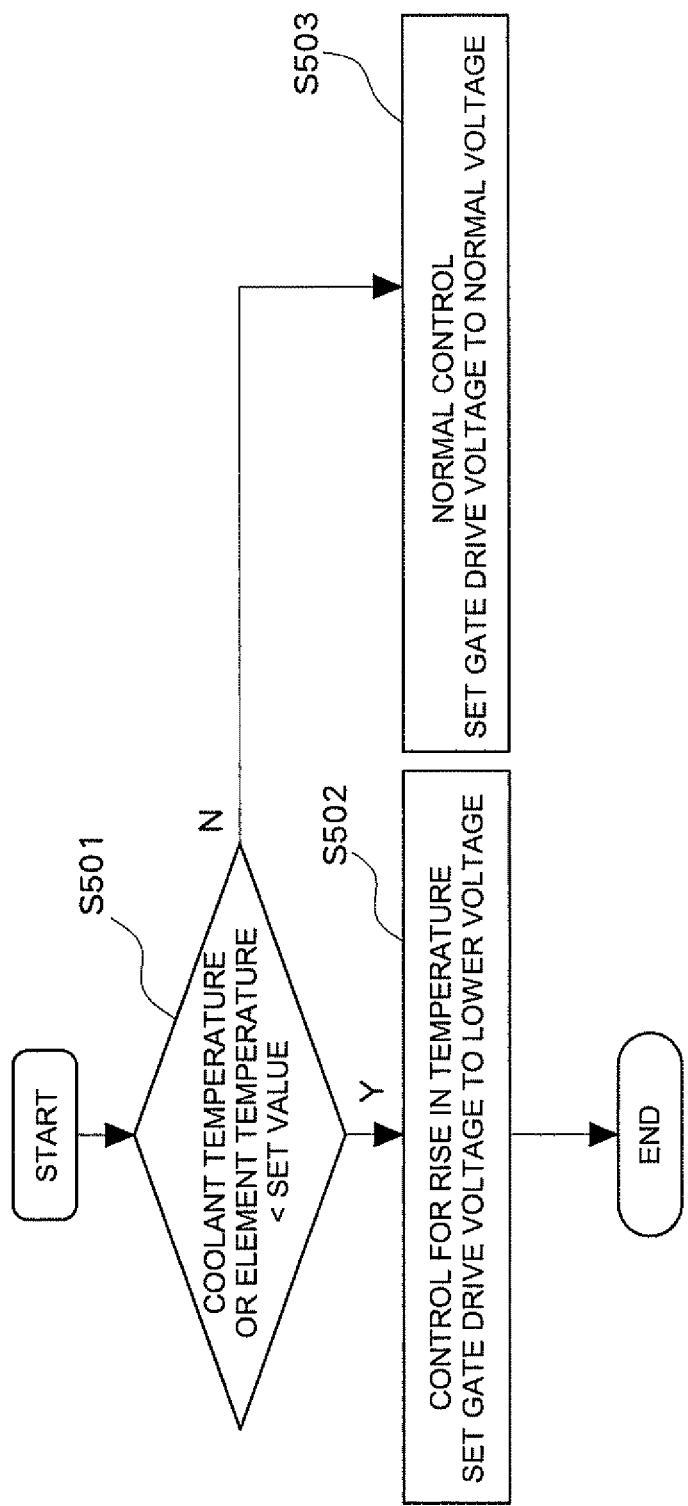
FIG. 12 is a flowchart of processing according to still a further embodiment.

FIG. 12 illustrates a processing flowchart according to the present embodiment. The gate voltage calculating unit 20 compares the element temperature of IGBT or the coolant temperature detected by the IGBT temperature detection unit 14 with a predetermined threshold temperature (S501). If the element temperature or the coolant temperature is lower than the threshold temperature, the gate voltage is set to a low voltage to achieve rise in the temperature (S502). At this time, the gate voltage has a value which is lower than the gate voltage set in step S104 of FIG. 3. On the other hand, if the element temperature or the coolant temperature is equal to or higher than the threshold temperature, the gate voltage is set to a normal value (S503). The gate voltage at this time is the gate voltage set in step S104 of FIG. 3.

Fourth Embodiment

Figure 13:
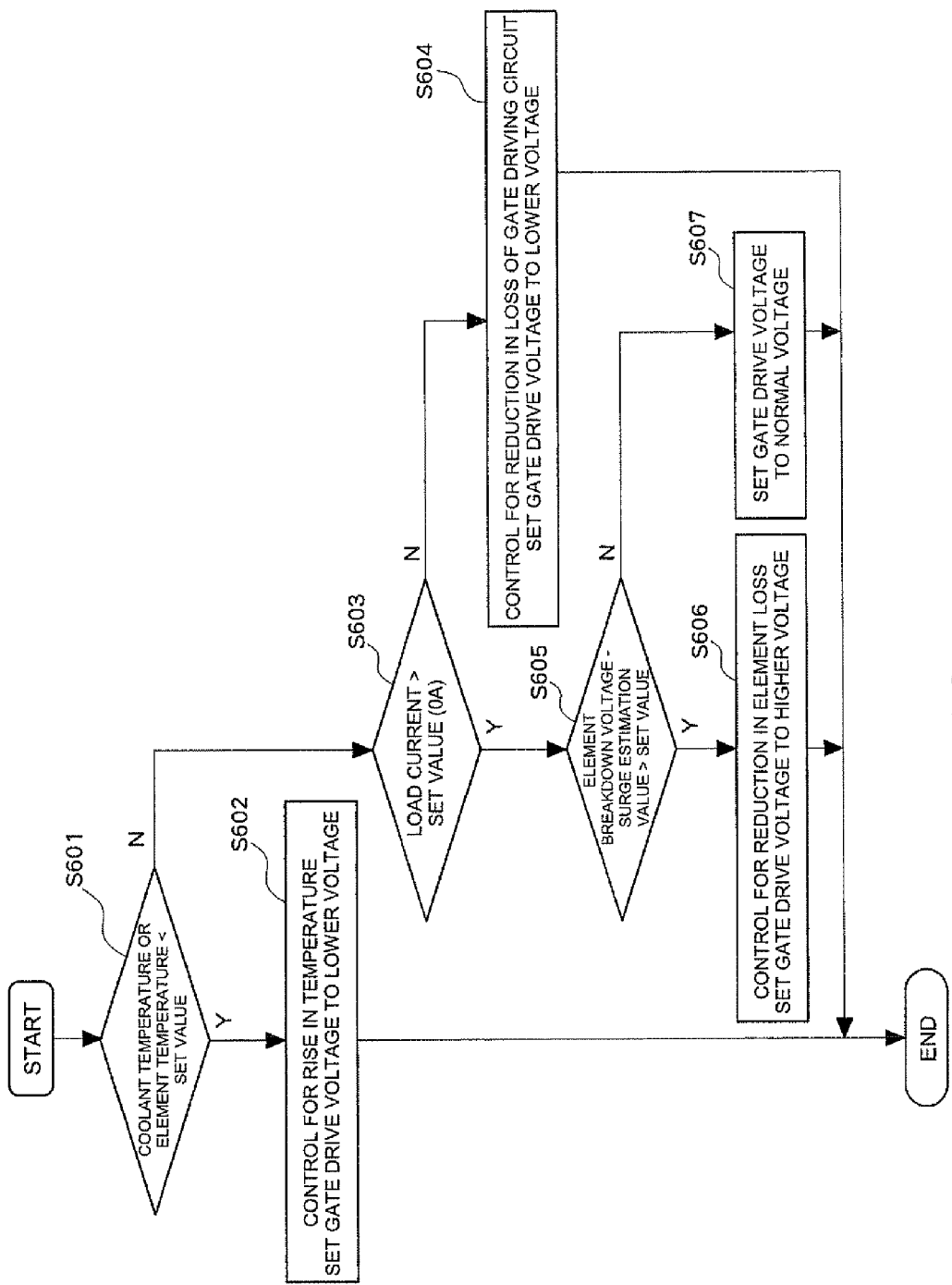
FIG. 13 is a flowchart of processing according to yet another embodiment.

FIG. 13 illustrates a processing flowchart obtained by a combination of the processing according to the first to third embodiments. The gate voltage calculating unit 20 determines whether or not the IGBT temperature or the coolant temperature is lower than a predetermined threshold temperature (S601). If the IGBT temperature or the coolant temperature is lower than the predetermined threshold temperature, the gate voltage is set to a value which is lower than the normal value, to thereby achieve rise in the temperature by using heat generated by the stationary loss (S602).

On the other hand, if the IGBT temperature or the coolant temperature is equal to or higher than the predetermined threshold temperature, then, whether or not the load current exceeds a threshold value (e.g. 0 A) is determined (S603). If the load current does not exceed the threshold value, the gate voltage of an IGBT in which no current flows is set to a low voltage so as to reduce loss of the drive circuit 22*c* (S604). If the load current exceeds the threshold value, the gate voltage of the IGBT in which current flows is set in accordance with the processing according to the first embodiment. More specifically, the surge voltage is calculated (estimated), and whether or not a difference between the element breakdown voltage and the surge voltage exceeds a threshold value is determined (S605). If the difference between the element breakdown voltage and the surge voltage exceeds the threshold value; i.e., if a margin exists in the surge voltage, the gate voltage is set to a value which is higher than a normal value (S606). Further, if the difference between the element breakdown voltage and the surge voltage is equal to or less than the threshold value; i.e., if a margin does not exist in the surge voltage, the gate voltage is set to a normal value (S607).

According to the present embodiment, by controlling the gate voltage in a detailed manner, it becomes possible to reduce the switching loss and the stationary loss and also to increase the stationary loss systematically at the time of low temperature to thereby achieve a rise in temperature. Thus, effective drive of the inverter can be achieved, which further results in an increase in the fuel efficiency when the inverter is installed in a hybrid vehicle or the like.

While the embodiments of the present invention have been described above, the present invention is not limited to these examples, and various changes can be made.

For example, although, in the processing flowchart illustrated in FIG. 13, whether or not the gate voltage is to be decreased is first determined based on the IGBT temperature or the coolant temperature, it is also possible to first determine whether or not the gate voltage is to be increased based on the determination as to whether or not a margin exists in the surge voltage and, if no margin exists in the surge voltage, to further determine whether or not the gate voltage is to be decreased based on the IGBT temperature or the coolant temperature.

It is also possible to first determine whether or not the gate voltage is to be increased based on the determination as to whether or not a margin exists in the surge voltage, and then further determine whether or not the gate voltage is to be decreased based on the IGBT temperature or the coolant temperature both when a margin exists in the surge voltage and when no margin exists in the surge voltage. In this case, if a margin exists in the surge voltage, the gate voltage is set to a high value Vg1 which is higher than the normal value Vg0, and then, if the IGBT temperature or the coolant temperature is low, the gate voltage is set to Vg2, which is lower than Vg1. Further, if no margin exists in the surge voltage, the gate voltage is set to the normal value Vg0, and then, if the IGBT temperature or the coolant temperature is low, the gate voltage is set to Vg3, which is lower than Vg0.

Further, it is also possible to first set a first gate voltage based on determination as to whether or not a margin exists in the surge voltage, then adjust the first gate voltage based on the magnitude of the load current to a second gate voltage, and further adjust the second gate voltage based on the IGBT temperature or the coolant temperature to a third gate voltage. More specifically, if it is first determined that no margin exists in the surge voltage, the first gate voltage is set to the normal value Vg0, and then if the load current is low, the first gate voltage is adjusted to the second voltage, Vg4, which is lower than Vg0. Further, when the IGBT temperature or the coolant temperature is low, the second gate voltage is adjusted to the third gate voltage Vg5, which is higher than Vg4, for example.

The invention claimed is:

1. A device for driving an inverter having a semiconductor switching element, the device comprising:
   an operation unit which calculates a surge voltage based on at least a temperature, an electric current, and a direct current side voltage of the semiconductor switching element; and
   a gate voltage application unit which applies a gate voltage to a gate of the semiconductor switching element, the gate voltage application unit controlling increase and decrease of the gate voltage based on a comparison result between the surge voltage which is calculated and an element breakdown voltage of the semiconductor switching element, wherein the gate voltage application unit controls the gate voltage to a value which is higher than a predetermined reference value when the surge voltage is less than the element breakdown voltage and a difference between the surge voltage and the element breakdown voltage exceeds a predetermined threshold voltage, and sets the gate voltage to the reference value when the surge voltage is less than the element breakdown voltage and a difference between the surge voltage and the element breakdown voltage is equal to or less than the predetermined threshold value.

2. The device according to claim 1, wherein
   the gate voltage application unit sets the gate voltage to a value which is lower than the predetermined reference value when an electric current flowing in the switching element is equal to or less than a predetermined threshold current.

3. The device according to claim 1, wherein
   the gate voltage application unit sets the gate voltage to a value which is lower than the predetermined reference value or a value which is still lower than the gate voltage which has been increased or decreased, when a temperature of the switching element is equal to or less than a predetermined threshold temperature.

4. The device according to claim 1, wherein
   the gate voltage application unit includes:
   an insulating power source provided for each semiconductor switching element;
   a voltage conversion unit which increases or decreases a voltage from the insulating power source based on the surge voltage and the element breakdown voltage of the semiconductor switching element; and
   a switching unit which is provided between the voltage conversion unit and the semiconductor switching element, the switching unit being opened or closed in accordance with a predetermined switching command to thereby apply a voltage output from the voltage conversion unit to the gate of the semiconductor switching element.

* * * * *